United States Patent
Yasui et al.

(10) Patent No.: US 7,200,007 B2
(45) Date of Patent: Apr. 3, 2007

(54) POWER STACK

(75) Inventors: Hidehiko Yasui, Kariya (JP); Hiroshi Ishiyama, Chiryu (JP)

(73) Assignee: Denso Corporation, Kariya (JP)

( * ) Notice: Subject to any disclaimer, the term of this patent is extended or adjusted under 35 U.S.C. 154(b) by 112 days.

(21) Appl. No.: 11/129,371

(22) Filed: May 16, 2005

(65) Prior Publication Data

US 2005/0259402 A1   Nov. 24, 2005

(30) Foreign Application Priority Data

May 18, 2004   (JP)   .............................. 2004-147691

(51) Int. Cl.
    *H05K 7/20*   (2006.01)
(52) U.S. Cl. ...................... 361/716; 361/698; 361/699; 361/718; 257/675; 257/686; 257/714; 165/80.4; 338/53; 338/319
(58) Field of Classification Search ................ 361/687, 361/698, 699, 716, 718, 724, 700, 701, 697, 361/702, 709, 711, 760; 29/888.045, 890.03, 29/890.032, 890.045, 895.212, 726, 726.5; 257/712, 714, 715, 685, 686, 777; 62/259.2; 165/80.4, 134.1; 338/53, 319
    See application file for complete search history.

(56) References Cited

U.S. PATENT DOCUMENTS

| | | | | | |
|---|---|---|---|---|---|
| 2,179,293 A | * | 11/1939 | Hein | ........................... | 257/658 |
| 2,501,331 A | * | 3/1950 | Hein | ........................... | 257/658 |
| 3,573,569 A | * | 4/1971 | Davis et al. | ................. | 257/714 |
| 3,603,381 A | * | 9/1971 | Scherbaum et al. | ........ | 165/80.4 |
| 4,420,739 A | * | 12/1983 | Herren | ........................... | 338/53 |
| 4,578,745 A | * | 3/1986 | Olsson | ........................... | 363/68 |
| 4,841,355 A | * | 6/1989 | Parks | ........................... | 257/686 |
| 6,542,365 B2 | | 4/2003 | Inoue | | |
| 6,845,012 B2 | | 1/2005 | Ohkouchi | | |
| 7,030,486 B1 | * | 4/2006 | Marshall | ..................... | 257/712 |
| 2004/0144996 A1 | | 7/2004 | Inoue | | |
| 2005/0040515 A1 | | 2/2005 | Inoue et al. | | |

FOREIGN PATENT DOCUMENTS

| | | |
|---|---|---|
| JP | A 3-76256 | 4/1991 |
| JP | Y2 6-10696 | 3/1994 |
| JP | B2 7-3846 | 1/1995 |
| JP | A 9-129794 | 5/1997 |

(Continued)

OTHER PUBLICATIONS

U.S. Appl. No. 10/733,472, filed Dec. 12, 2003, Sakai.
Translation of Jan. 5, 2007 Office Action from corresponding Japanese priority application.

*Primary Examiner*—Michael Datskovskiy
(74) *Attorney, Agent, or Firm*—Oliff & Berridge, PLC

(57) ABSTRACT

A power stack includes cooling pipes and semiconductor modules which are alternately laminated. Each cooling pipe includes an inside space dissected into cooling passages in which coolant flows. Both surfaces of the semiconductor module in a laminating direction are brought into contact with surfaces of neighboring cooling pipes. The semiconductor modules are classified into a plurality of groups mutually differentiated in their heat generation rates. And, any two semiconductor modules belonging to the same group having the highest heat generation rate are spaced from each other so that a cooling pipe is not sandwiched between these semiconductor modules in the laminating direction.

14 Claims, 14 Drawing Sheets

FOREIGN PATENT DOCUMENTS

| | | |
|---|---|---|
| JP | A 11-214599 | 8/1999 |
| JP | B2 3049453 | 3/2000 |
| JP | A 2001-308263 | 11/2001 |
| JP | A 2001-320005 | 11/2001 |
| JP | A 2001-326310 | 11/2001 |
| JP | A 2002-26215 | 1/2002 |
| JP | A-2002-043487 | 2/2002 |
| JP | A 2004-214623 | 7/2004 |

* cited by examiner

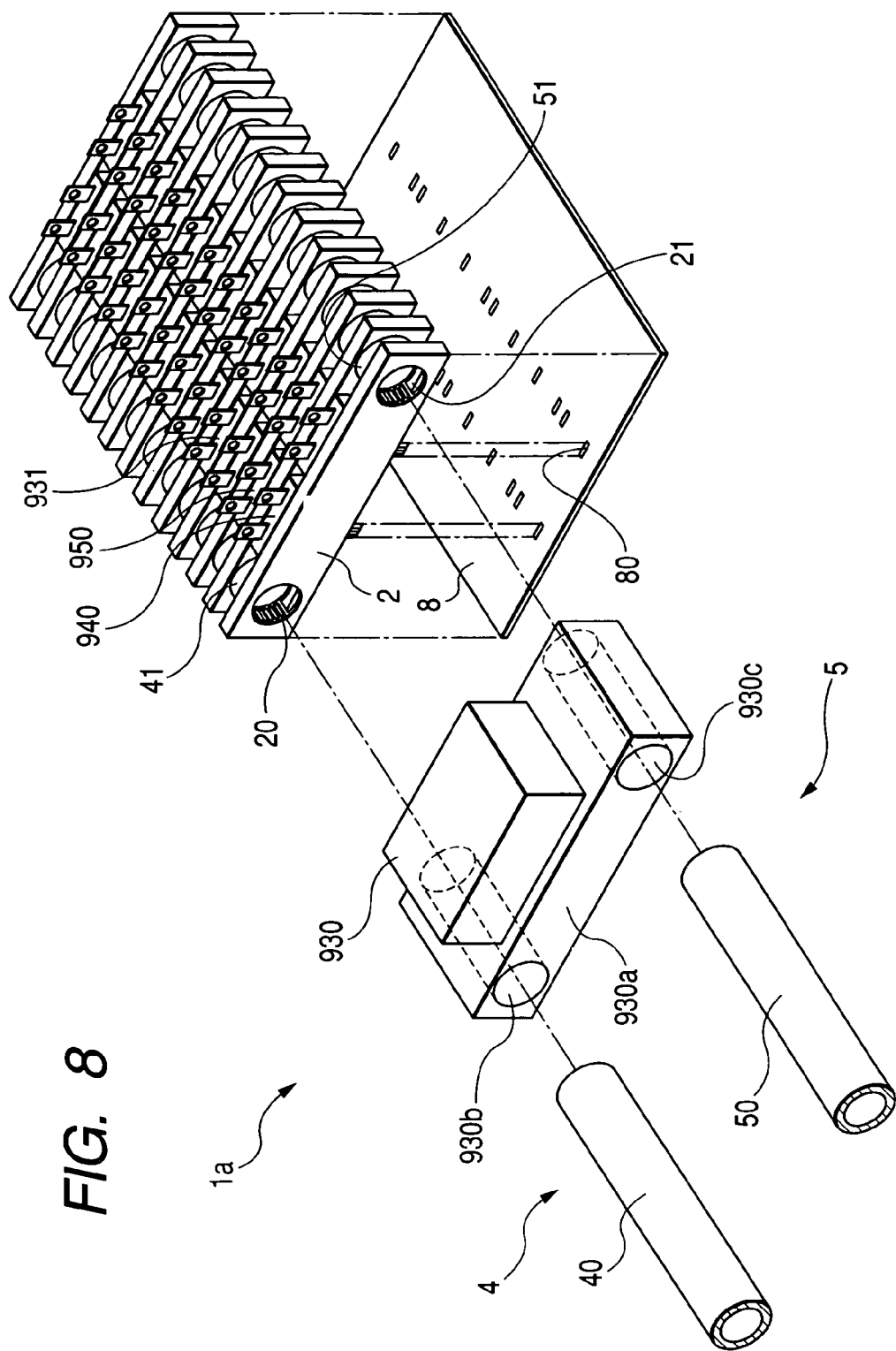

POWER STACK

CROSS-REFERENCE TO RELATED APPLICATION

This application is based upon and claims the benefit of priority from earlier Japanese Patent Application No. 2004-147691 filed on May 18, 2004 so that the description of which is incorporated herein by reference.

BACKGROUND OF THE INVENTION

The present invention relates to a power stack which is preferable used as a driving apparatus for an automotive electric rotary machine.

For example, the following prior art documents 1 to 4 respectively disclose a power stack including cooling members and semiconductor elements alternately laminated, according to which the semiconductor element is sandwiched between a pair of cooling members disposed in the laminating direction. The heat generated from the semiconductor element is absorbed by these cooling members. Therefore, the power stacks disclosed in the prior art documents 1 to 4 can prevent thermal breakdown of semiconductor elements.

1: Japanese Patent Application Laid-open No. 11-214599 (1999)
2: Japanese Patent Publication No. 7-3846 (1995)
3: Japanese Patent Application Laid-open No. 3-76256 (1991)
4: Japanese Utility Model Publication No. 6-10696 (1994)

However, the above-described prior art documents 1 to 4 disclose nothing about the layout of the semiconductor elements in the power stack. Therefore, according to the power stacks disclosed in the prior art documents 1 to 4, the power stack will have bad cooling balance as a whole when the semiconductor elements have different heat generation rates.

More specifically, the heat generation rate of the semiconductor element depends on electric output power, conduction time, and operation timing of a controlled object device. This is the reason why the semiconductor elements have different heat generation rates. If the layout of semiconductor elements is determined without considering differences of heat generation rates, the power stack will have undesirably deviated distribution of heat generation rates as a whole. Having the undesirably deviated distribution of heat generation rates is not desirable because portions having higher cooling efficiencies and portions having lower cooling efficiencies appear locally in the power stack. In short, the power stack as a whole has a bad cooling balance.

Accordingly, there will be a possibility that semiconductor elements cannot be sufficiently cooled in a case that the layout of semiconductor elements in the power stack is improper.

SUMMARY OF THE INVENTION

In view of the above-described problems, the present invention has an object to provide a power stack capable of reducing or eliminating local deterioration in the cooling efficiency and accordingly capable of assuring excellent cooling balance.

In order to accomplish the above and other related object, the present invention provides a first power stack including a plurality of cooling pipes and a plurality of semiconductor modules which are alternately laminated. Each of the plurality of cooling pipes includes an inside space dissected into cooling passages in which coolant flows. Both surfaces of the semiconductor module in a laminating direction are brought into contact with surfaces of neighboring cooling pipes. The semiconductor modules are classified into a plurality of groups mutually differentiated in their heat generation rates. And, the semiconductor modules are disposed in such a manner that any two semiconductor modules belonging to the same group having the highest heat generation rate are prevented from being adjacent to each other so that a cooling pipe is not sandwiched between these semiconductor modules of the same group in the laminating direction. In this case, the "heat generation rate" represents a heat generation amount per unit time.

The first power stack of the present invention includes a plurality of cooling pipes and a plurality of semiconductor modules. The semiconductor modules are classified into a plurality of groups mutually differentiated in their heat generation rates. If a cooling pipe is sandwiched between a pair of semiconductor modules belonging to the group having the highest heat generation rate, the heat amount transferred at the same time from the semiconductor modules to this cooling pipe will become locally larger. Accordingly, the cooling efficiency will be worsened at the portion corresponding to the cooling pipes sandwiched by the semiconductor modules belonging to the group having the highest heat generation rate.

In view of the above-described points, the first power stack of the present invention employs a layout of preventing a cooling pipe from being disposed between a pair of semiconductor modules belonging to the group having the highest heat generation rate. Therefore, the first power stack of the present invention can reduce or eliminate local deterioration in the cooling efficiency. Accordingly, the first power stack of the present invention has excellent cooling balance.

According to the first power stack, it is preferable that the groups of semiconductor modules are classified according to controlled object devices of respective semiconductor modules. The operation timings of different controlled object devices tend to disagree. Accordingly, the heat generation rates of different controlled object devices will not agree. In view of the foregoing, this arrangement employs the way of classifying the semiconductor modules into a plurality of groups according to differences of controlled object devices. This arrangement brings the effect of relatively simply accomplishing the grouping of the semiconductor modules.

According to the first power stack, it is preferable that the semiconductor modules and the cooling pipes respectively have a configuration flattened in the laminating direction. This arrangement brings the effect of securing a large contact area, i.e. a large heat transfer area, between the semiconductor module and the cooling pipe. Furthermore, the length of the power stack in the laminating direction can be shortened.

According to the first power stack, it is preferable that the semiconductor modules are repeatedly disposed in the laminating direction according to a predetermined pattern based on the groups. Namely, according to this arrangement, plural semiconductor modules belonging to different groups are disposed regularly according to a predetermined pattern. This arrangement brings the effect of relatively simply attaining an ideal layout by repeating the predetermined pattern in the laminating direction. The ideal layout is that any cooling pipe is prevented from being disposed between a pair of semiconductor modules belonging to the group having the highest heat generation rate. Namely, it becomes possible to relatively simply assign the positions of respective semiconductor modules. This is convenient, especially, in a case that the total number of semiconductor modules is relatively large.

According to the first power stack, it is preferable to further include a control circuit board having a plurality of connecting members to which the semiconductor modules are respectively connected. And, the connecting members are repeatedly disposed in the laminating direction according to a pattern identical with the pattern of the semiconductor modules.

According to this arrangement, the layout pattern of the semiconductor modules agrees with the layout pattern of the connecting members. Therefore, wiring work for connecting the semiconductor modules and the connecting members can be simplified.

Furthermore, as one example of the layout pattern of the semiconductor modules, it will be possible to continuously dispose the semiconductor modules belonging to the same group in the laminating direction. In such a case, the above arrangement can shorten the length of the control circuit board in the laminating direction. More specifically, the connecting members of the semiconductor modules belonging to the same group can be disposed relatively densely on the control circuit board in the laminating direction. Therefore, continuously disposing the semiconductor modules belonging to the same group in the laminating direction brings the effect of shortening the entire length of the connecting members in the laminating direction, as well as the length of the control circuit board in the laminating direction, compared with a case that the semiconductor modules belonging to different groups are alternately disposed in the laminating direction.

According to the first power stack, it is preferable to further include an inlet pipe for introducing the coolant dividedly into the plurality of cooling pipes and an outlet pipe for collecting the coolant from the plurality of cooling pipes after finishing heat exchange. The inlet pipe and the outlet pipe are disposed substantially parallel to each other. And, a heat-generating member is interposed between a pre-division section of the inlet pipe and a post-merger section of the outlet pipe.

According to this arrangement, the heat-generating member other than the semiconductor modules is interposed between the inlet pipe and the outlet pipe. With this arrangement, the heat-generating member can be effectively cooled by at least one of the cooling pipe (i.e. the cooling pipe closest to the heat-generating member), the inlet pipe, and the outlet pipe.

According to the first power stack, it is preferable that a straight section is provided at a predetermined position of the pre-division section where the heat-generating member is disposed. Providing the straight section at the pre-division section of the inlet pipe is effective in regulating the flow of the coolant before being divided into the cooling pipes. Accordingly, this arrangement brings the effect of suppressing turbulence occurring in the coolant flowing in the pre-division section. According to this arrangement, division of the coolant into a plurality of cooling pipes can be stabilized. Thus, cooling performances of respective cooling pipes can be equalized. Accordingly, this arrangement can realize a power stack having excellent cooling balance.

According to the first power stack, it is preferable that at least one of the semiconductor modules is a dummy module generating no heat. No heat is transferred from the dummy module to the cooling pipes. Accordingly, it is for example possible to dispose the dummy module on one face of a cooling pipe in the laminating direction and dispose the semiconductor module on the other face of this cooling pipe. In this case, the cooling pipe has a face contacting with the face of the semiconductor module and accordingly can effectively absorb the heat generated from the semiconductor module. According to this arrangement, it is unnecessary to consider the heat transfer from the dummy module to the cooling pipe and accordingly the layout of semiconductor modules can be variously changed or modified.

Furthermore, disposing the dummy module makes it possible to reduce or eliminate the clearance between neighboring cooling pipes. Therefore, it becomes possible to suppress the deformation, such as deflection and warpage, of respective cooling pipes. Thus, this arrangement can improve the contact between the semiconductor modules and the cooling pipes.

Furthermore, in order to accomplish the above and other related object, the present invention provides a second power stack including a plurality of cooling pipes and a plurality of semiconductor modules which are alternately laminated. Each of the plurality of cooling pipes includes an inside space dissected into cooling passages in which coolant flows. Both surfaces of the semiconductor module in a laminating direction are brought into contact with surfaces of neighboring cooling pipes. The semiconductor modules are classified into a plurality of groups mutually differentiated in their heat generation rates. The plural semiconductor modules are disposed in such a manner that at least two semiconductor modules are disposed along a flow direction of the coolant in the cooling pipe. And, the heat generation rate of the semiconductor module disposed at an upstream side is not smaller than the heat generation rate of the semiconductor module disposed at a downstream side.

The coolant temperature in the cooling passage is lower at the upstream side than the downstream side. Therefore, the cooling ability of the cooling pipe is higher at the upstream side than the downstream side. If the semiconductor module having a smaller heat generation rate is disposed at the upstream side and the semiconductor module having a larger heat generation rate is disposed at the downstream side, the cooling ability at the upstream side will be excessive and the cooling ability at the downstream side will be insufficient. In short, the cooling efficiency will be unbalanced.

In view of the foregoing, the second power stack of the present invention employs a layout of disposing the semiconductor module having a larger heat generation rate at the upstream side and disposing the semiconductor module having a smaller heat generation rate at the downstream side. In other words, the heat generation rate of the semiconductor module disposed at the upstream side is not smaller than the heat generation rate of the semiconductor module disposed at the downstream side. Accordingly, the second power stack of the present invention brings the effect of reducing unbalance in the cooling efficiency. Accordingly, the second power stack of the present invention has excellent cooling balance.

According to the second power stack, it is preferable that the groups of semiconductor modules are classified according to controlled object devices of the semiconductor module. The operation timings of different controlled object devices tend to disagree. Accordingly, the heat generation rates of different controlled object devices will not agree. In view of the foregoing, this arrangement employs the way of classifying the semiconductor modules into a plurality of groups according to differences of controlled object devices. This arrangement brings the effect of relatively simply accomplishing the grouping of the semiconductor modules.

According to the second power stack, it is preferable that the semiconductor modules and the cooling pipes respectively have a configuration flattened in the laminating direction. This arrangement brings the effect of securing a large contact area, i.e. a large heat transfer area, between the semiconductor module and the cooling pipe. Furthermore, the length of the power stack in the laminating direction can be shortened.

According to the second power stack, it is preferable to further include an inlet pipe for introducing the coolant dividedly into the plurality of cooling pipes and an outlet pipe for collecting the coolant from the plurality of cooling pipes after finishing heat exchange. The inlet pipe and the outlet pipe are disposed substantially parallel to each other. And, a heat-generating member is interposed between a pre-division section of the inlet pipe and a post-merger section of the outlet pipe.

According to this arrangement, the heat-generating member other than the semiconductor modules is interposed between the inlet pipe and the outlet pipe. With this arrangement, the heat-generating member can be effectively cooled by at least one of the cooling pipe (i.e. the cooling pipe closest to the heat-generating member), the inlet pipe, and the outlet pipe.

According to the second power stack, it is preferable that a straight section is provided at a predetermined position of the pre-division section where the heat-generating member is disposed. Providing the straight section at the pre-division section of the inlet pipe is effective in regulating the flow of the coolant before being divided. Accordingly, this arrangement brings the effect of suppressing turbulence occurring in the coolant flowing in the pre-division section. According to this arrangement, division of the coolant into a plurality of cooling pipes can be stabilized. Thus, cooling performances of respective cooling pipes can be equalized. Accordingly, this arrangement can realize a power stack having excellent cooling balance.

According to the second power stack, it is preferable that at least one of the semiconductor modules is a dummy module generating no heat. No heat is transferred from the dummy module to the cooling pipes. Accordingly, it is for example possible to dispose the dummy module on one face of a cooling pipe in the laminating direction and dispose the semiconductor module on the other face of this cooling pipe. In this case, the cooling pipe has a face contacting with the face of the semiconductor module and accordingly can effectively absorb the heat generated from the semiconductor module. According to this arrangement, it is unnecessary to consider the heat transfer from the dummy module to the cooling pipe and accordingly the layout of semiconductor modules can be variously changed or modified.

Furthermore, disposing the dummy module makes it possible to reduce or eliminate the clearance between neighboring cooling pipes. Therefore, it becomes possible to suppress the deformation, such as deflection and warpage, of respective cooling pipes. Thus, this arrangement can improve the contact between the semiconductor modules and the cooling pipes.

As apparent from the foregoing, the present invention can provide a power stack capable of preventing the cooling efficiency from locally deteriorating and assuring excellent cooling balance.

BRIEF DESCRIPTION OF THE DRAWINGS

The above and other objects, features and advantages of the present invention will become more apparent from the following detailed description which is to be read in conjunction with the accompanying drawings, in which:

FIG. 8 is a partly exploded perspective view showing a power stack in accordance with a second embodiment of the present invention;

DESCRIPTION OF THE PREFERRED EMBODIMENTS

Preferred embodiments of the present invention will be explained hereinafter with reference to attached drawings.

Hereinafter, the power stack of the present invention will be explained in accordance with preferred embodiments.

First Embodiment

Figure 1:
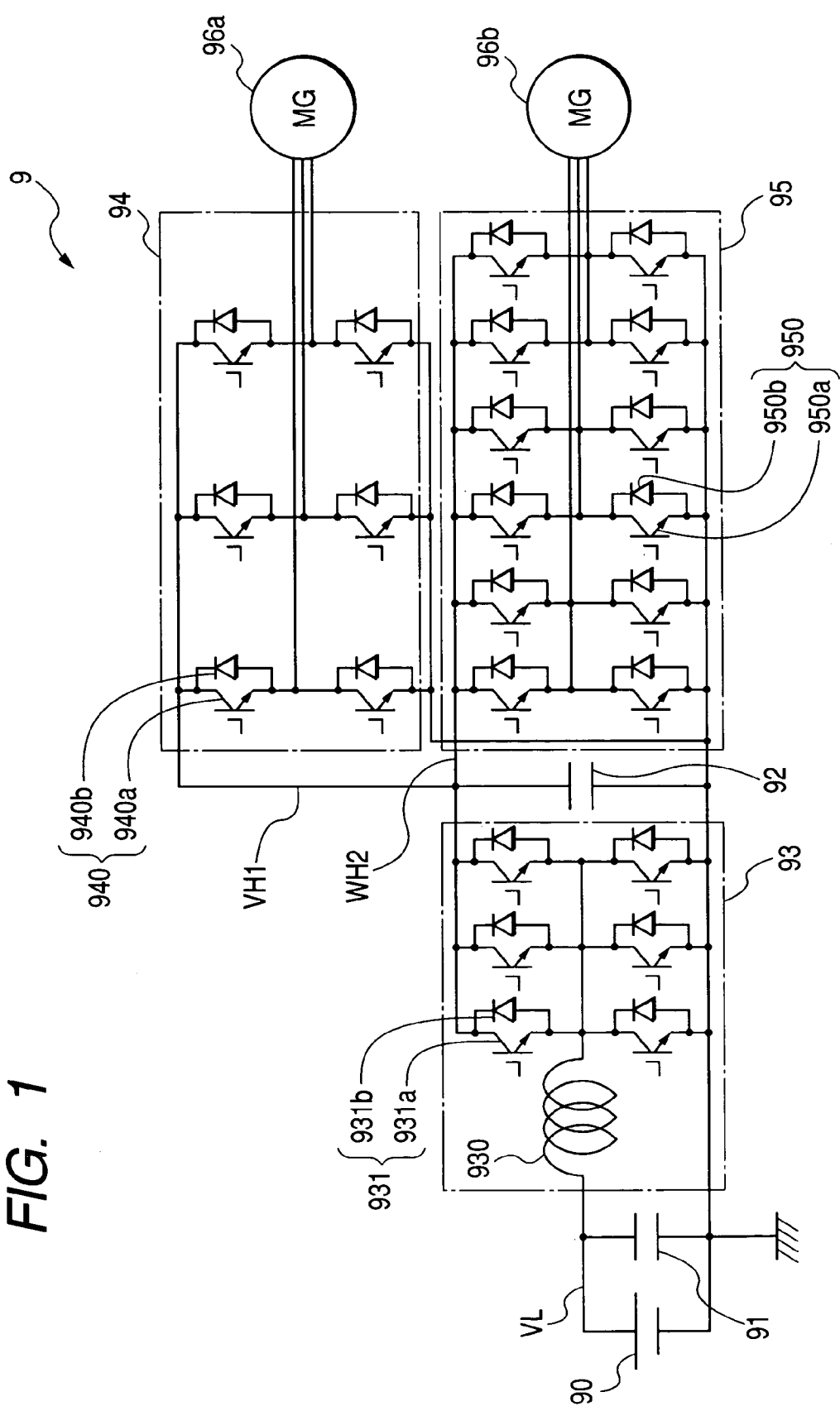
FIG. 1 is a circuit diagram showing a driving apparatus of an electric motor/generator using a power stack in accordance with a first embodiment of the present invention.

First, a driving apparatus for a MG (i.e. electric Motor/Generator) will be explained as an example using a power stack of this embodiment. FIG. 1 shows a circuit diagram of this driving apparatus. As shown in the drawing, a driving apparatus 9 includes a battery 90, smoothing capacitors 91 and 92, a DC—DC converter 93, a first inverter circuit 94, and a second inverter circuit 95.

The DC—DC converter 93 includes an electric reactor 930 and a plurality of converter switching modules 931. One end of the electric reactor 930 is connected to a connecting point of high-potential side converter switching modules 931 and low-potential side converter switching modules 931 which are later described in more detail. The other end of the electric reactor 930 is connected to a high-voltage terminal of the battery 90 via a low-voltage power line VL.

Each converter switching module 931 consists of an IGBT (i.e. Insulated Gate Bipolar Transistor) 931*a* and a flywheel diode 931*b*. Each flywheel diode 931*b*, disposed in the reversed direction, is connected in parallel with an associated IGBT 931*a*. A total of six converter switching modules 931 are classified into three high-potential side converter switching modules 931 and three low-potential side converter switching modules 931. The high-potential side converter switching modules 931 are respectively connected to high-voltage power lines VH1 and VH2. Furthermore, the low-potential side converter switching modules 931 are grounded.

The first inverter circuit 94 includes a plurality of (i.e. a total of six) first switching modules 940. The first switching modules 940 are included in the semiconductor modules of the present invention. Each first switching module 940 consists of an IGBT 940*a* and a flywheel diode 940*b*. Each flywheel diode 940*b*, disposed in the reversed direction, is connected in parallel with an associated IGBT 940*a*.

The second inverter circuit 95 includes a plurality of (i.e. a total of twelve) second switching modules 950. The second switching modules 950 are included in the semiconductor modules of the present invention. Each second switching module 950 consists of an IGBT 950*a* and a flywheel diode 950*b*. Each flywheel diode 950*b*, disposed in the reversed direction, is connected in parallel with an associated IGBT 950*a*.

The MG driving apparatus using the power stack of this embodiment operates in the following manner. In the case of electric driving operation (i.e. power running operation), the IGBT 931*a* of each low-potential side converter switching modules 931 is controlled by PWM switching. When the IGBT 931*a* is turned on, electromagnetic energy is stored in the electric reactor 930.

In this condition, when the IGBT 931*a* is turned off, the electric reactor 930 tends to maintain current condition. Therefore, the current flows via the flywheel diodes 931*b* of respective high-potential side converter switching modules 931 to the high-voltage power lines VH1 and VH2. By repeating this operation, high DC voltage is continuously applied to the high-voltage power lines VH1 and VH2.

The first inverter circuit 94 converts the high DC voltage of high-voltage power line VH1 into a three-phase AC voltage and applies this three-phase AC voltage to stator coils (not shown) of MG 96*a*. Similarly, the second inverter circuit 95 converts the high DC voltage of high-voltage power line VH2 into a three-phase AC voltage and applies this three-phase AC voltage to stator coils (not shown) of MG 96*b*. MG 96*a* and MG 96*b* are included in the controlled object device of the present invention.

In the case of power generating operation (i.e. regenerative operation), the IGBT 931*a* of each high-potential side converter switching module 931 is controlled by PWM switching. When the IGBT 931*a* is turned on, the current flows from the high-voltage power lines VH1 and VH2 to the battery 90 via the IGBT 931*a* and the electric reactor 930. Therefore, electromagnetic energy is stored in the electric reactor 930.

In this condition, when the IGBT 931*a* is turned off, the electric reactor 930 tends to maintain current condition. Therefore, the current flows via the flywheel diodes 931*b* of respective low-potential side converter switching modules 931 to the battery 90. By repeating this operation, the DC voltage is continuously applied to the battery 90.

Next, the relationship between the heat generation rate of the first switching module and the heat generation rate of the second switching module will be explained. The total number (i.e. six in total) of parallel first switching modules 940 is smaller than the total number (i.e. twelve in total) of parallel second switching modules 950. Therefore, the heat generation rate of each first switching module 940 is larger than the heat generation rate of each second switching module 950.

Furthermore, operation timings of six first switching modules 940 in operating MG 96*a* agree with each other. Similarly, operation timings of twelve second switching modules 950 in operating MG 96*b* agree with each other. However, the operation timing of MG 96*a* disagrees with the operation timing of MG 96*b*. Therefore, the operation timing of the first switching module 940 disagrees with the operation timing of the second switching module 950. Accordingly, the heat generation rate in the first switching module 940 is maximized at the time different from the time the heat generation rate in the second switching module 950 is maximized.

Figure 2:
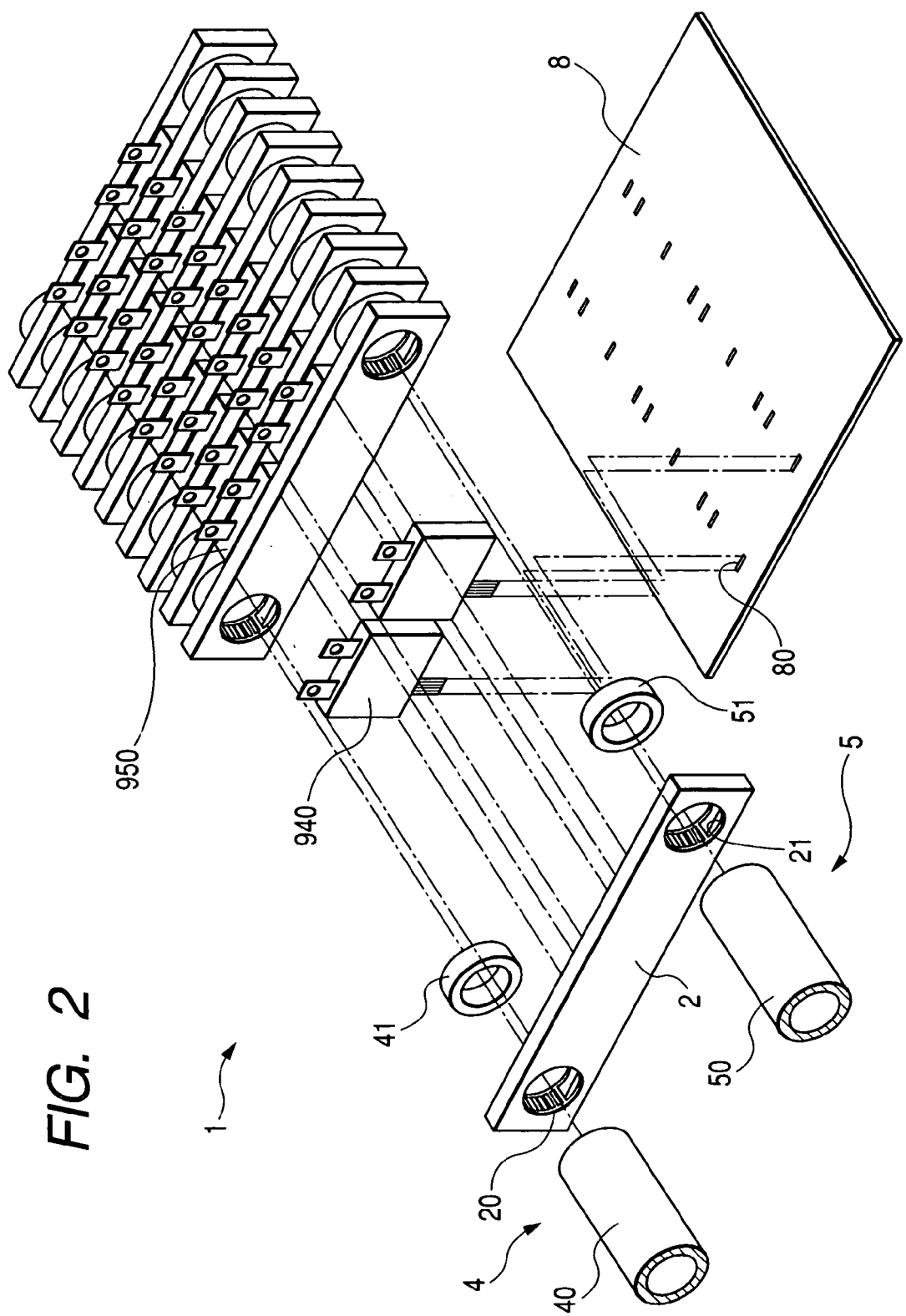
FIG. 2 is a partly exploded perspective view showing the power stack in accordance with the first embodiment of the present invention.
Figure 3:
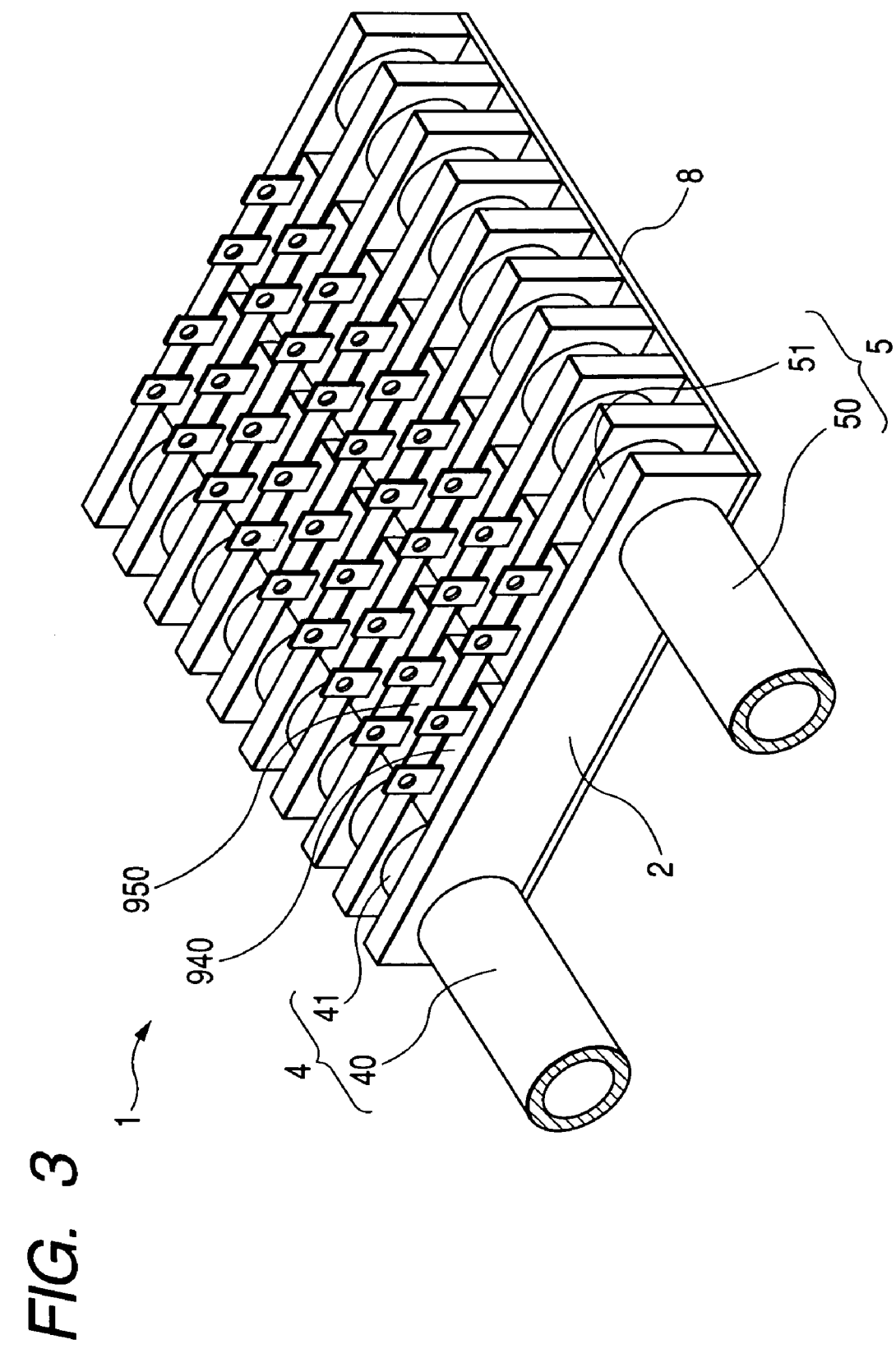
FIG. 3 is a perspective view showing an assembled condition of the power stack in accordance with the first embodiment of the present invention.
Figure 4:
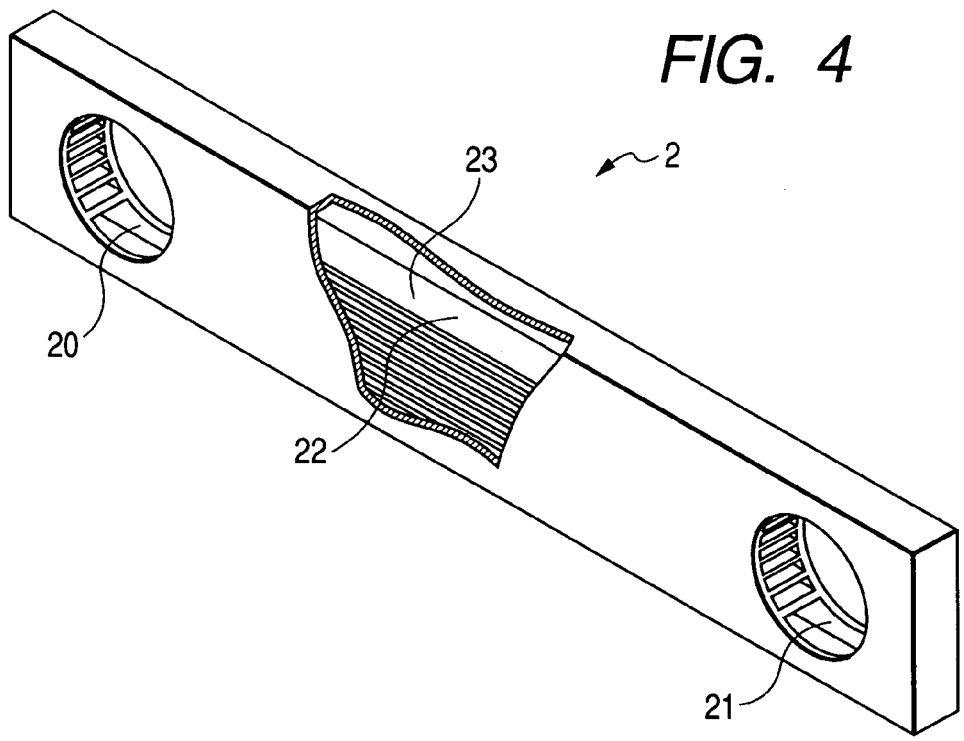
FIG. 4 is a partly cross-sectional perspective view showing a cooling pipe of the power stack in accordance with the first embodiment of the present invention.
Figure 5:
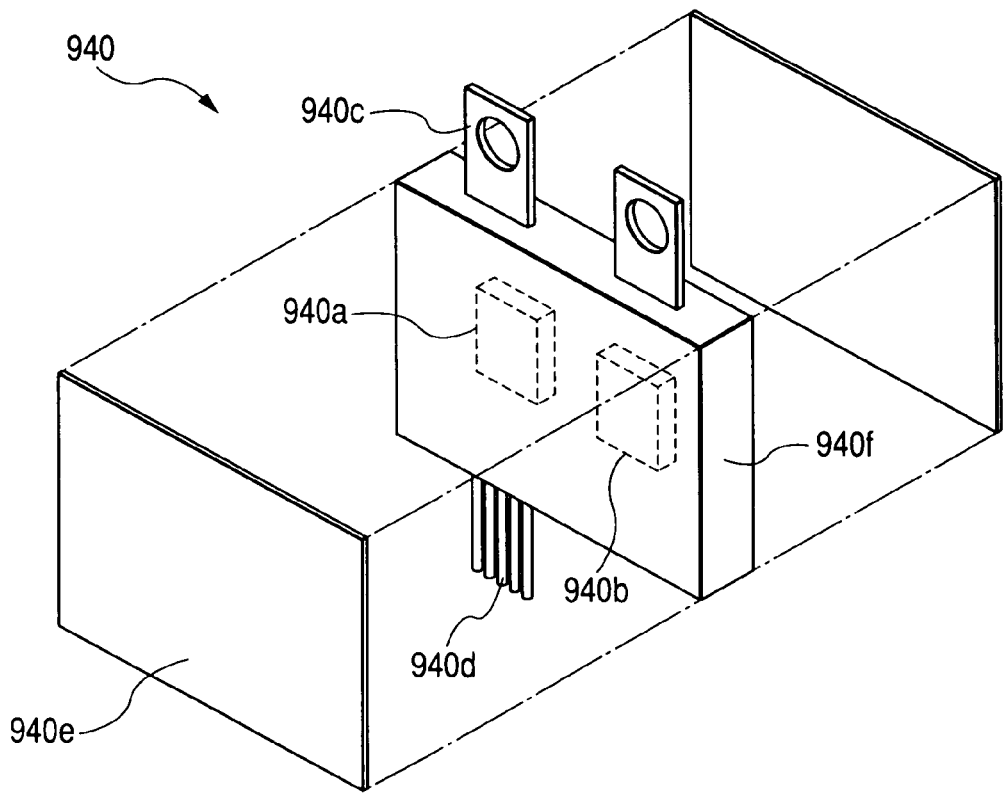
FIG. 5 is an exploded perspective view showing a first switching module of the power stack in accordance with the first embodiment of the present invention.
Figure 6:
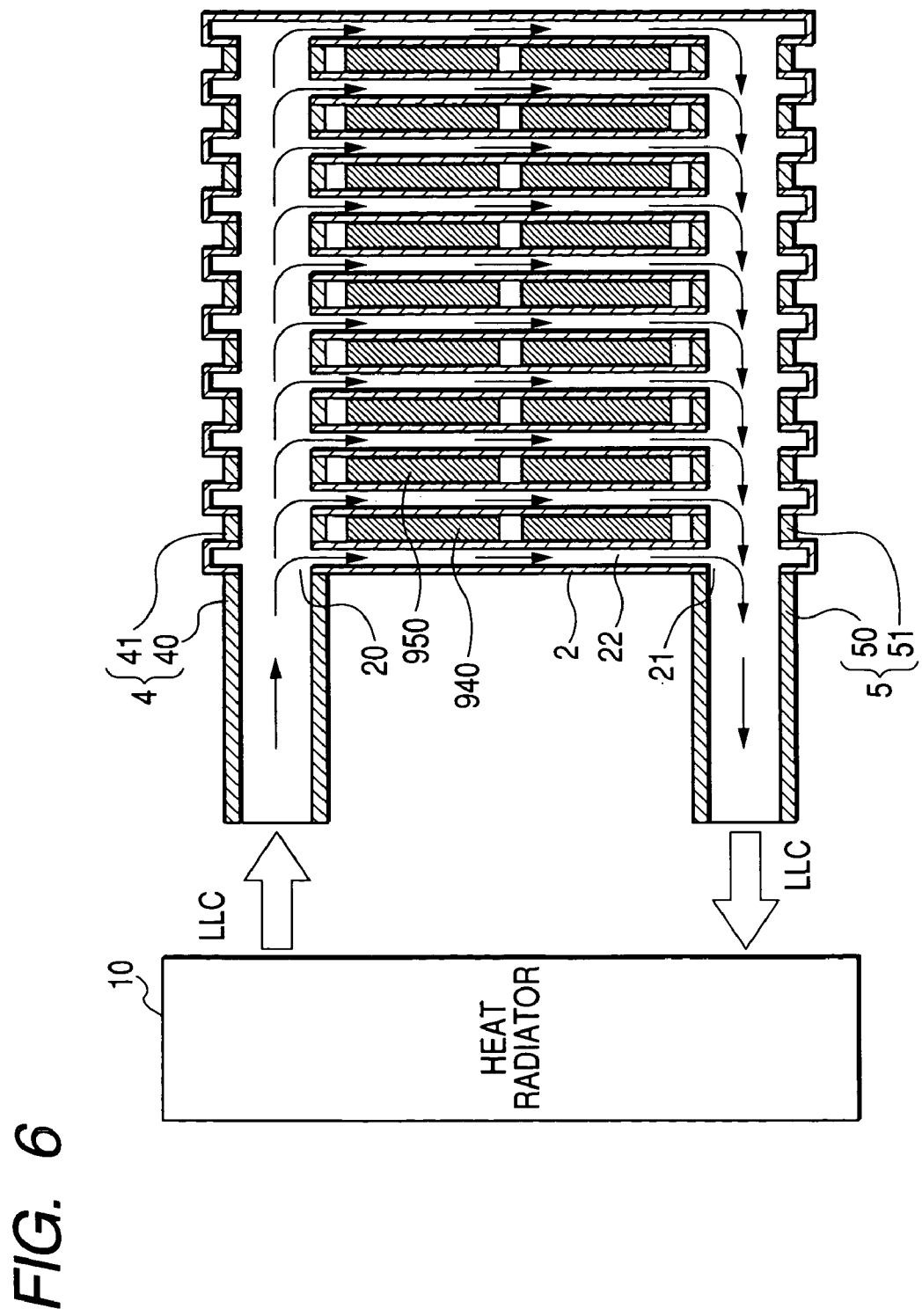
FIG. 6 is a cross-sectional view showing the power stack in accordance with the first embodiment of the present invention, seen in a laminating direction.

Next, the arrangement of the power stack in accordance with this embodiment will be explained. FIG. 2 shows a partly exploded perspective view of the power stack in accordance with this embodiment. FIG. 3 shows a perspective view of an assembled condition of this power stack. FIG. 4 shows a partly cross-sectional perspective view of a cooling pipe of this power stack. FIG. 5 shows an exploded perspective view of a first switching module of this power stack. FIG. 6 shows a cross-sectional view showing this power stack, seen in a laminating direction.

As shown in these drawings, the power stack 1 of this embodiment includes a plurality of cooling pipes 2, a plurality of first switching modules 940, a plurality of second switching modules 950, an inlet pipe 4, an outlet pipe 5, and a control circuit board 8.

The cooling pipe 2 is an aluminum member having a rectangular body flattened along a plane perpendicular to the laminating direction. An inlet port 20 and an outlet port 21 are opened at both longitudinal ends of the cooling pipe 2. The inside space of the cooling pipe 2 is dissected into a plurality of cooling passages 22 by a plurality of cooling ribs 23. Each cooling passage 22 extends in the longitudinal direction. The inlet port 20 communicates with the outlet port 21 via the cooling passages 22. The cooling passages 22, ten in total, are disposed in substantially parallel with each other.

The inlet pipe 4 consists of a main inlet pipe 40 and a plurality of communicating inlet pipes 41. Each communicating inlet pipe 41 is a short aluminum member having an axially expandable cylindrical body. The communicating inlet pipe 41 connects the inlet ports 20 of mutually neighboring cooling pipes 2. The communicating inlet pipes 41, nine in total, are disposed substantially in a line.

The main inlet pipe 40 is a long aluminum member having an axially extending cylindrical body. The main inlet pipe 40 is longer than each communicating inlet pipe 41. The one end of the main inlet pipe 40 covers the inlet port 20 of the cooling pipe 2 positioned at one end of the laminating direction. Long Life Coolant (i.e. LLC) mixed with water is introduced from a heat radiator 10 to the cooling pipe 2 via the main inlet pipe 40. LLC is contained in the coolant of the present invention.

The outlet pipe 5 consists of a main outlet pipe 50 and a plurality of communicating outlet pipes 51. Each communicating outlet pipe 51 is a short aluminum member having an axially expandable cylindrical body. Each communicating outlet pipe 51 connects the outlet ports 21 of mutually neighboring cooling pipes 2. The communicating outlet pipes 51, nine in total, are disposed substantially in a line.

The main outlet pipe 50 is a long aluminum member having a cylindrical body. The main outlet pipe 50 is disposed in substantially parallel with the main inlet pipe 40. The one end of the main outlet pipe 50 covers the outlet port 21 of the cooling pipe 2 positioned at one end of the laminating direction. After finishing heat exchange, LLC is discharged from the cooling pipe 2 to the heat radiator 10 via the main outlet pipe 50.

The first switching module 940 includes the IGBT 940a (indicated by a dotted line in FIG. 5), the flywheel diode 940b (indicated by a dotted line in FIG. 5), electrode terminals 940c, signal terminals 940d, insulating plates 940e, and a resin mold 940f. The resin mold 940f is an insulating resin member having a rectangular body flattened in the laminating direction. Both of the IGBT 940a and the flywheel diode 940b are embedded and sealed in the resin mold 940f. The electrode terminals 940c, two in total, are copper plate members protruding outward from the upper surface of the resin mold 940f. One electrode terminal 940c is connected to the high-voltage side of the parallel circuit consisting of the IGBT 940a and the flywheel diode 940b (refer to FIG. 1). The other electrode terminal 940c is connected to the low-voltage side of the parallel circuit consisting of the IGBT 940a and the flywheel diode 940b. The signal terminals 940d, five in total, are copper pins protruding outward from the lower surface of the resin mold 940f. The signal terminals 940d are connected to a corresponding connecting member 80 provided on the control circuit board 8. The control circuit board 8 has a total of eighteen connecting members 80, i.e. six connecting members 80 for the first switching modules 940 and twelve connecting members for the second switching modules 950. Various signals, such as gate and emitter signals and a current-mirror signal, are entered from the control circuit board 8 to the IGBT 940a via the signal terminals 940d. The insulating plates 940e are ceramic member having a rectangular plate shape. The insulating plates 940e, two in total, are disposed at both end surfaces of the resin mold 940f in the laminating direction.

The arrangement of the first switching module 940 is similar to the arrangement of the second switching module 950. Accordingly, the arrangement of the second switching module 950 is not explained in detail.

Two of the six first switching modules 940 and twelve second switching modules 950 are interposed between two neighboring cooling pipes 2. Regarding the detailed layout of the first switching modules 940 and the second switching modules 950 will be explained later.

Hereinafter, the flow of LLC in the power stack of this embodiment will be explained. As shown in FIG. 6, LLC is supplied from the heat radiator 10 to the main inlet pipe 40. Then, LLC of the main inlet pipe 40 is introduced directly or via the communicating inlet pipe 41 into the cooling passages 22 of ten cooling pipes 2. Meanwhile, the first switching modules 940 and the second switching module 950 generate a significant amount of heat due to the above-described electric driving operation and the power generating operation. The heat generated form the first switching modules 940 and the second switching module 950 is transferred to LLC flowing in the cooling passages 22 via the walls of respective cooling pipes 2. After receiving the heat from the first switching modules 940 and the second switching module 950, LLC of the cooling passages 22 flows directly or via the communicating outlet pipe 51 into the main outlet pipe 50. Then, LLC of the main outlet pipe 50 is discharged to the heat radiator 10 and cooled down there, and is again introduced into the main inlet pipe 40. Namely, LLC circulates along the route of heat radiator 10→inlet pipe 4→cooling pipe 2 (i.e. cooling passage 22)→outlet pipe 5→heat radiator 10 extending from the heat radiator 10 to the power stack 1. Thus, LLC has the function of maintaining the temperatures of the first switching modules 940 and the second switching modules 950 within respective allowable temperatures.

Figure 7A:
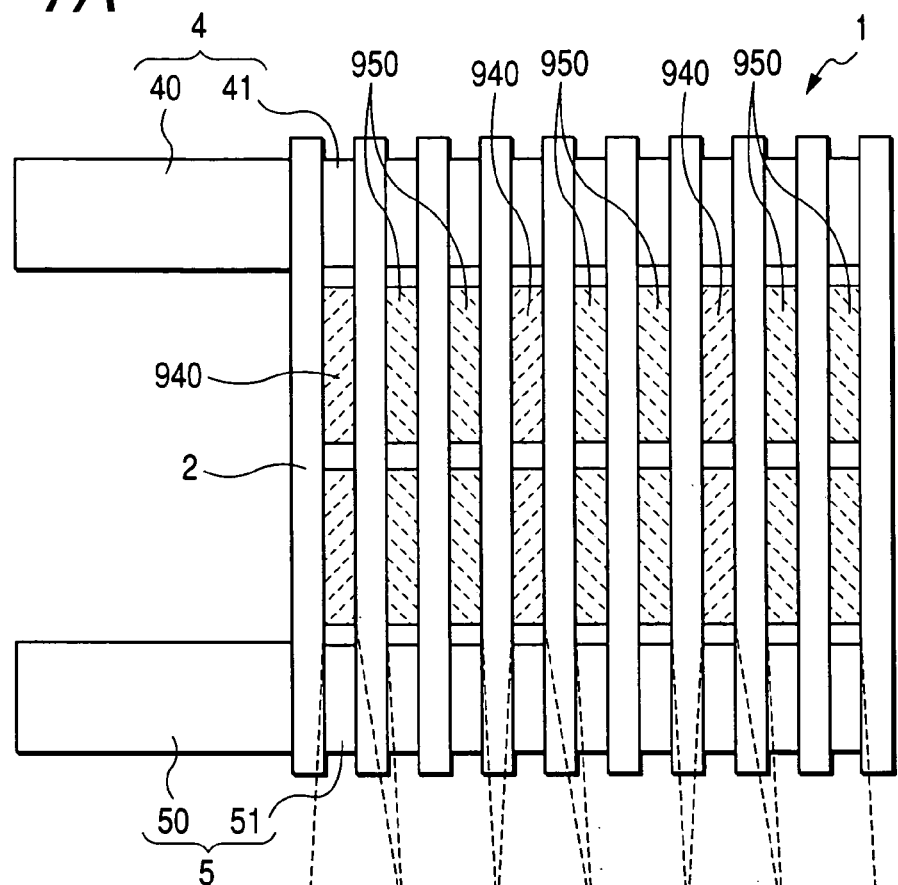
FIG. 7A is a plan view schematically showing the power stack in accordance with the first embodiment of the present invention, seen in the laminating direction.
Figure 7B:
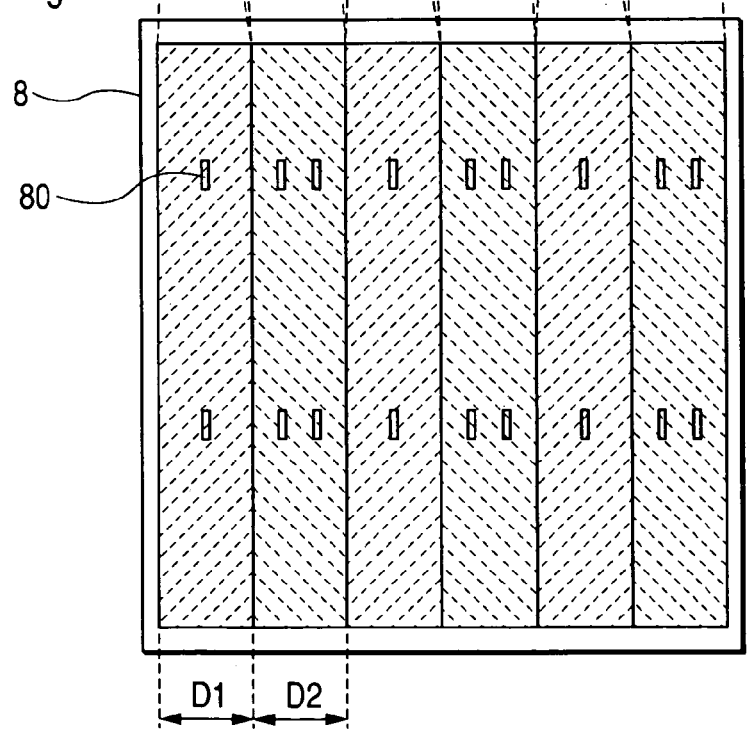
FIG. 7B is a plan view schematically showing a control circuit board of the power stack in accordance with the first embodiment of the present invention, seen in the laminating direction.

Next, the layout of the first switching modules and the second switching modules of the power stack in accordance with this embodiment will be explained with reference to the attached drawings. FIG. 7A shows a schematic plan view of the power stack in accordance with this embodiment. FIG. 7B shows a schematic plan view of a control circuit board of the power stack in accordance with this embodiment.

As shown in FIG. 7A, the first switching modules 940 (indicated by right-ascending hatching lines) and the second switching modules 950 (indicated by left-ascending hatching lines) are repeatedly disposed in the laminating direction according to a predetermined pattern.

More specifically, in the direction advancing from the main inlet pipe 40 and the main outlet pipe 50 to the opposite side, the pattern consisting of one row of first switching modules 940 (i.e. one row consisting of two first switching modules 940) and two rows of second switching modules 950 (i.e. two rows each consisting of two second switching modules 950) is repeated three times.

Adopting the above-described layout of the first switching modules 940 and the second switching modules 950 shown in FIG. 7A can prevent the cooling pipe 2 from being sandwiched between two first switching modules 940 from both sides in the laminating direction. More specifically, the cooling pipe 2 is sandwiched between the first switching module 940 and the second switching module 950, or between a pair of second switching modules 950.

Furthermore, according to the above-described layout of the first switching modules 940 and the second switching modules 950, two serial rows of second switching modules 950 are cyclically disposed in the laminating direction. As shown in FIG. 7B, the clearance between the connecting members 80 of two second switching modules 950 mutually neighboring in the laminating direction is relatively short. On the other hand, the clearance between the connecting member 80 of the first switching module 940 and the connecting member 80 of the second switching module 950 mutually neighboring in the laminating direction is relatively long. Therefore, an area width D2 of the layout area for the connecting members 80 of two rows of second switching modules 950 (indicated by left-ascending hatching lines) substantially agrees with an area width D1 of the layout area for the connecting members 80 of one row of first switching modules 940 (indicated by right-ascending hatching lines).

Next, the functions and effects of the power stack according to this embodiment will be explained.

According to the power stack 1 of this embodiment, none of the cooling pipes 2 are sandwiched between two first switching modules 940 having larger heat generation rates from both sides in the laminating direction (refer to FIG. 7A). Therefore, this embodiment can reduce or eliminate local increase in the heat generation rate. In other words, it becomes possible to reduce or eliminate the imbalance in the cooling efficiency. Accordingly, the power stack 1 of this embodiment has excellent cooling balance.

Furthermore, the first switching module 940, the second switching module 950, and the cooling pipe 2 respectively have a body flattened in the laminating direction. Therefore, the heat transfer area between the first switching module 940 and the cooling pipe 2 is relatively large, and also the heat transfer area between the second switching module 950 and the cooling pipe 2 is relatively large. Furthermore, using the first switching modules 940, the second switching modules 950, and the cooling pipes 2 of flat configurations makes it possible to reduce the length of power stack 1 in the laminating direction.

Furthermore, according to the power stack 1 of this embodiment, the first switching modules 940 and the second switching modules 950 are repeatedly disposed in the laminating direction according to the above-described pattern consisting of one row (of first switching modules 940) and two rows (of second switching modules 950) (refer to FIG. 7A). Thus, this embodiment only requires simply repeating this pattern in the laminating direction to attain an ideal layout having excellent cooling balance.

Furthermore, according to the power stack 1 of this embodiment, the above-described pattern of the first switching modules 940 and the second switching modules 950 agrees with the pattern of the connecting members 80 of the first switching modules 940 and the connecting members 80 of the second switching modules 950 (refer to FIGS. 7A and 7B). Therefore, in the assembling and/or mounting work, adjustment of the signal terminals 940*d* and the connecting members 80 can be easily done.

Furthermore, as described above, the area width D2 of the layout area for the connecting members 80 of two rows of second switching modules 950 substantially agrees with the area width D1 of the layout area for the connecting members 80 of one row of first switching modules 940. Accordingly, the area width can be reduced by serially disposing two rows of semiconductor modules belonging to the same group. Therefore, it becomes possible to reduce the length of control circuit board 8 in the laminating direction, compared with a case that one row of first switching module 940 and one row of second switching module 950 are alternately disposed in the laminating direction, Furthermore, as described above, the operation timing of MG 96*a* disagrees with the operation timing of MG 96*b*. Therefore, the heat generation rate in the first switching module 940 is maximized at the time different from the time the heat generation rate in the second switching module 950 is maximized. Accordingly, it becomes possible to prevent the cooling pipe 2 from receiving a great amount of heat generated from the first switching module 940 and the second switching module 950 disposed at both sides in the laminating direction. In this respect, the power stack 1 of this embodiment can reduce or eliminate the imbalance in the cooling efficiency.

Second Embodiment

The second embodiment is different from the first embodiment in that the electric reactor 930 and the converter switching module 931 shown in FIG. 1 are disposed in the power stack. Hereinafter, this embodiment is explained only about the differences.

Figure 9:
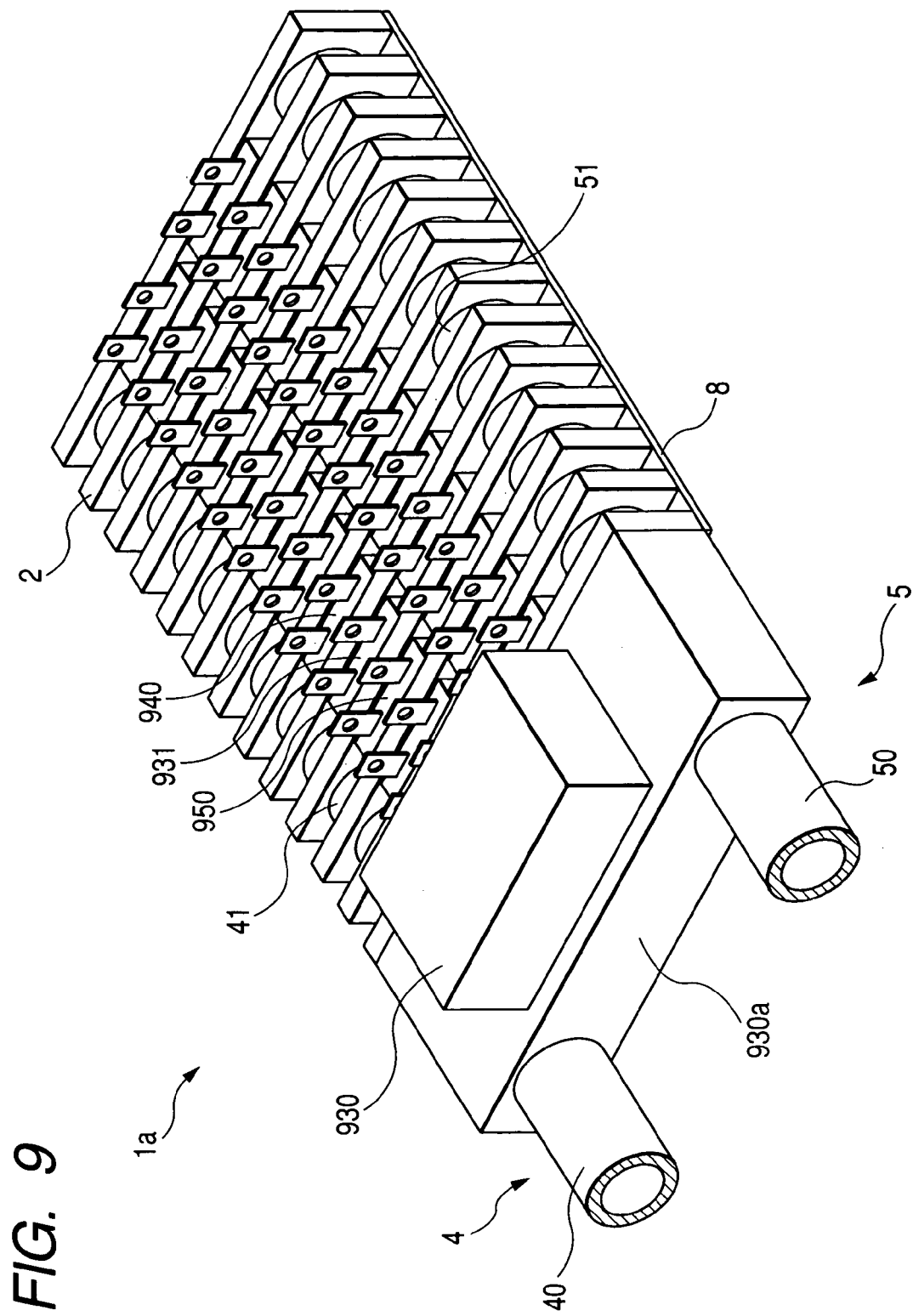
FIG. 9 is a perspective view showing an assembled condition of the power stack in accordance with the second embodiment of the present invention.
Figure 10:
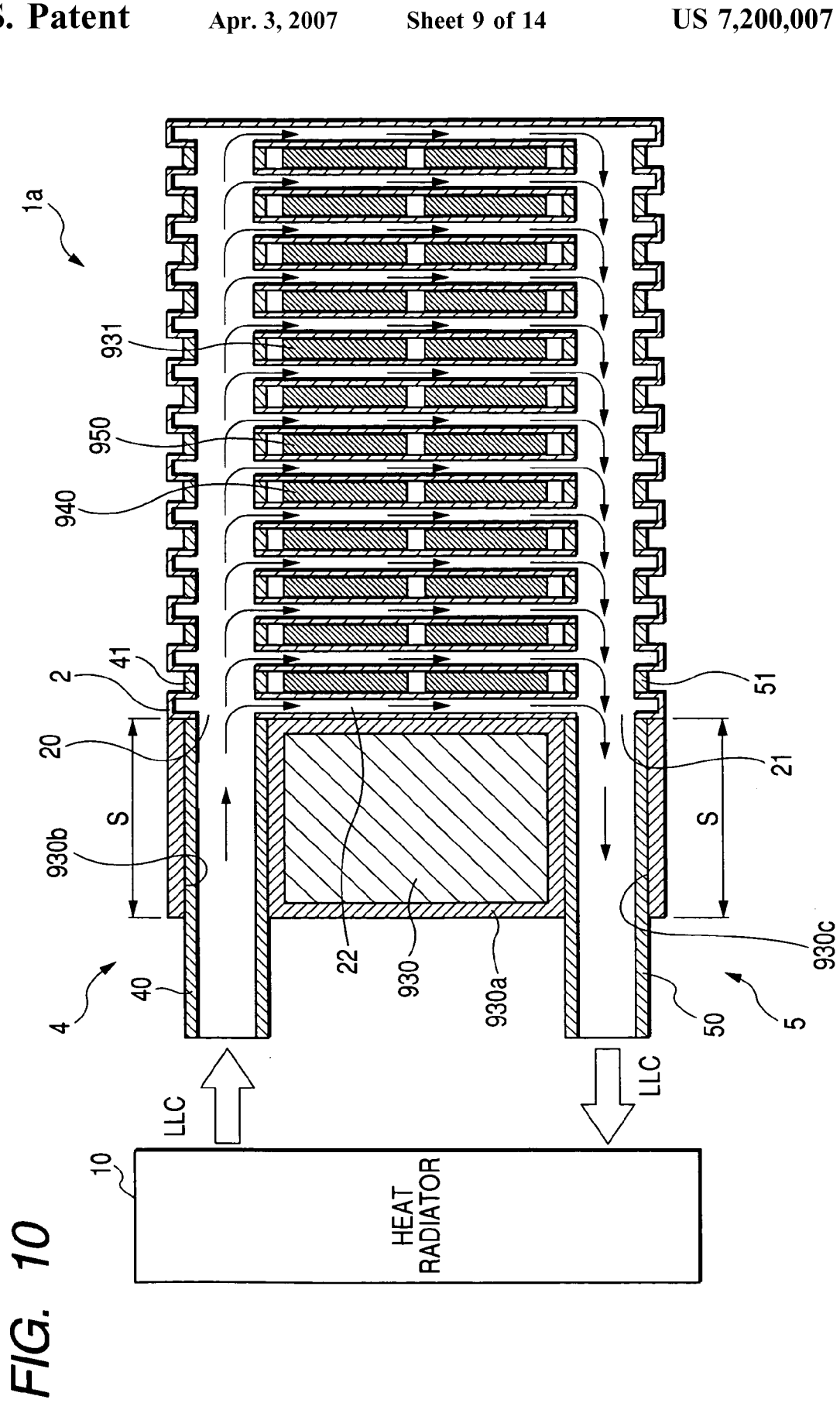
FIG. 10 is a cross-sectional view showing the power stack in accordance with the second embodiment of the present invention.

FIG. 8 shows a partly exploded perspective view of a power stack 1*a* in accordance with this embodiment. The components or portions corresponding to those shown in FIG. 2 are denoted by the same reference numerals. FIG. 9 shows a perspective view of an assembled condition of this power stack 1*a*. The components or portions corresponding to those shown in FIG. 3 are denoted by the same reference numerals. FIG. 10 shows a cross-sectional view of this power stack 1*a*. The components or portions corresponding to those shown in FIG. 6 are denoted by the same reference numerals.

For example, as understood from the comparison between FIG. 10 and FIG. 6, the power stack 1*a* ; of this embodiment has a main inlet pipe 40 and a main outlet pipe 50 which are longer than the main inlet pipe and the main outlet pipe of the power stack 1 disclosed in the first embodiment. An electric reactor casing 930*a*, being an aluminum casing having a boxlike shape, is supported between the main inlet pipe 40 and the main outlet pipe 50. More specifically, the electric reactor casing 930*a* has a main inlet pipe hole 930*b* and a main outlet pipe hole 930*c* at both ends in the longitudinal direction. The main inlet pipe 40 is inserted into the main inlet pipe hole 930*b* and the main outlet pipe 50 is inserted into the main outlet pipe hole 930*c*, when the electric reactor casing 930*a* is installed or assembled with the power stack 1*a*. Thus, the electric reactor casing 930*a* can surely straddle between the axially elongated portion of the main inlet pipe 40 and the axially elongated portion of the main outlet pipe 50. As shown in FIG. 10, the main inlet pipe 40 has a straight section S to be accommodated in the main inlet pipe hole 930*b*. Similarly, the main outlet pipe 50 has a straight section S to be accommodated in the main outlet pipe hole 930*c*. The electric reactor 930 is fixed in the electric reactor casing 930*a*. The electric reactor 930 is included in the heat-generating member of the present invention.

The converter switching modules 931, cooperating with this electric reactor 930, are interposed together with the first switching module 940 and the second switching module 950 in the clearances of the cooling pipes 2. The converter switching modules 931 are included in the semiconductor modules of the present invention. Each converter switching module 931 has an arrangement similar to the arrangement of the first switching module 940 shown in FIG. 5. As shown in FIG. 1, a total of six converter switching modules 931 are provided. Therefore, according to this embodiment, the number of the cooling pipes 2 is increased to thirteen in total from ten in the first embodiment.

Figure 11:
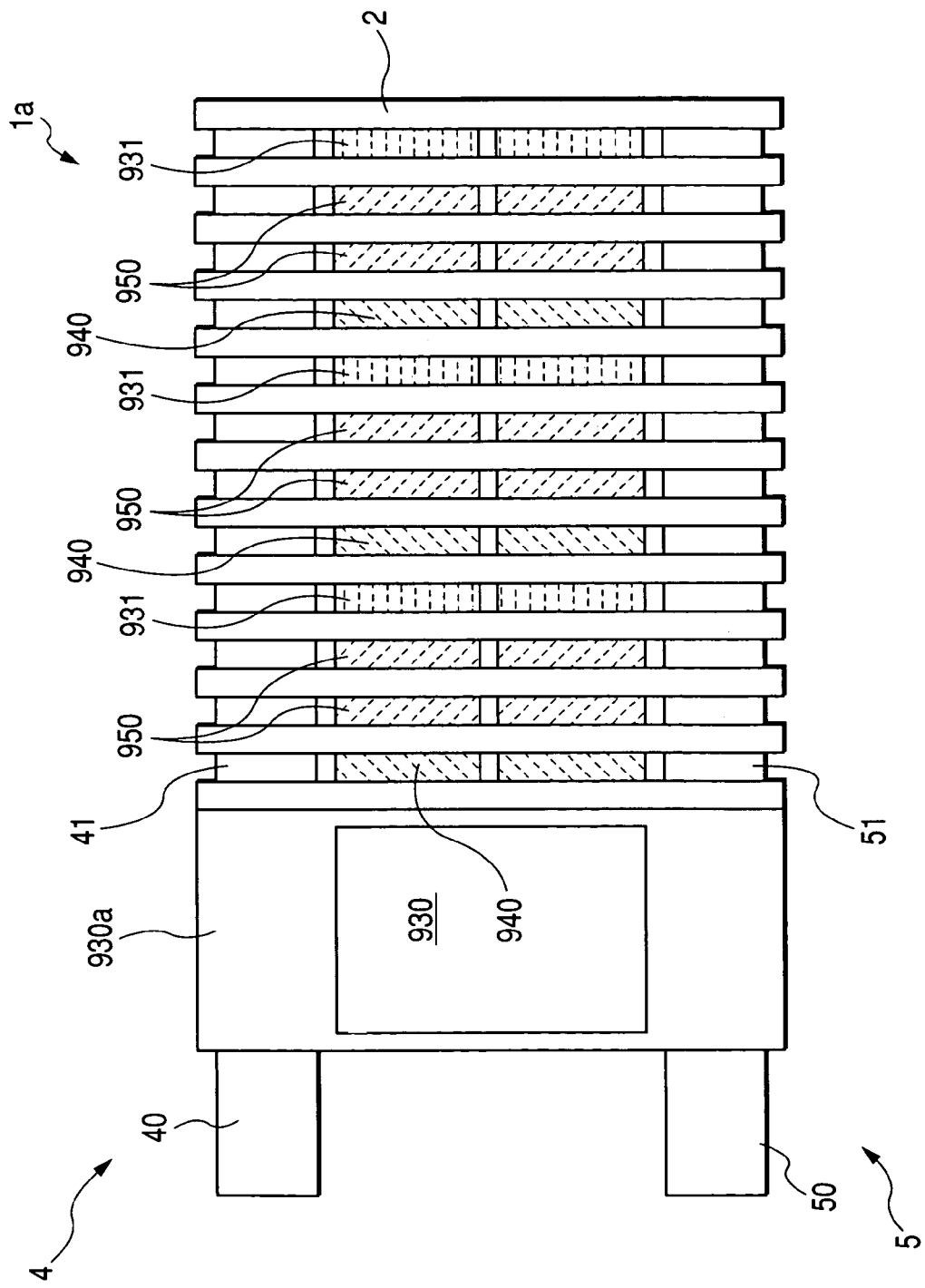
FIG. 11 is a plan view schematically showing the power stack in accordance with the second embodiment of the present invention.

FIG. 11 shows a schematic plan view of the power stack 1*a* in accordance with this embodiment. The components or portions corresponding to those shown in FIG. 7A are denoted by the same reference numerals and the same hatching. As shown in the drawing, the first switching modules 940, the second switching modules 950, and the converter switching modules 931 (indicated by lateral hatching lines) are repeatedly disposed in the laminating direction according to a predetermined pattern. More specifically, in the direction advancing from the main inlet pipe 40 and the main outlet pipe 50 to the opposite side, the pattern consisting of one row of first switching modules 940, two rows of second switching modules 950, and one row of converter switching modules 931 is repeated three times.

The power stack 1*a* of this embodiment brings substantially the same functions and effects as those of the power stack 1 of the first embodiment. Furthermore, according to the power stack 1a of this embodiment, the electric reactor 930 is surrounded along its three faces by the main inlet pipe 40, the cooling pipe 2, and the main outlet pipe 50. Thus, the electric reactor 930 can be effectively cooled.

Regarding the cooling ability, the U-shaped space in which the electric reactor 930 is placed is inferior to the clearances of the cooling pipes 2 which accommodate the first switching modules 940, the second switching modules 950, and the converter switching modules 931.

However, the heat generation rate of the electric reactor 930 is smaller than the heat generation rates of the first switching modules 940, the second switching modules 950, and the converter switching modules 931. Furthermore, the allowable temperature of the electric reactor 930 is higher than the allowable temperatures of the first switching modules 940, the second switching modules 950, and the converter switching modules 931. Therefore, the cooling ability of the above-described U-shaped space is sufficient to prevent or eliminate the thermal breakdown of the electric reactor 930. In this manner, the power stack 1a of this embodiment can effectively utilize a dead space extending between the pre-division section of the inlet pipe 4 and the post-merger section of the outlet pipe 5. Thus, the installation space required for the power stack can be reduced compared with a case that a dedicated space for the electric reactor 930 is additionally provided. Furthermore, the number of required parts can be reduced compared with the case that the dedicated space for the electric reactor 930 is additionally provided.

Furthermore, according to the power stack 1a of this embodiment, the main inlet pipe 40 has the straight section S to be accommodated in the main inlet pipe hole 930b and the main outlet pipe 50 has the straight section S to be accommodated in the main outlet pipe hole 930c (refer to FIG. 10).

Therefore, it becomes possible to regulate the flow of LLC in the pre-division section (i.e. at the inlet for the thirteen cooling pipes 2). Accordingly, it becomes possible to reduce or eliminate the turbulence occurring in LLC flowing in the pre-division section. Furthermore, it becomes possible to regulate the flow of LLC in the post-merger section (i.e. at the exit for the thirteen cooling pipes 2). Accordingly, it becomes possible to reduce or eliminate the turbulence occurring in LLC flowing in the post-merger section. The power stack 1a of this embodiment has a large circulating amount of LLC. Namely, the flow rate of LLC in the cooling passages 22 of respective cooling pipe 2 is increased. Accordingly, the heat amount transferred from respective cooling pipes 2 to LLC per unit time can be increased.

Third Embodiment

The third embodiment is different from the second embodiment in the layout of the first switching modules, the second switching modules, and the converter switching modules. Hereinafter, this embodiment is explained only about the differences.

Figure 12:
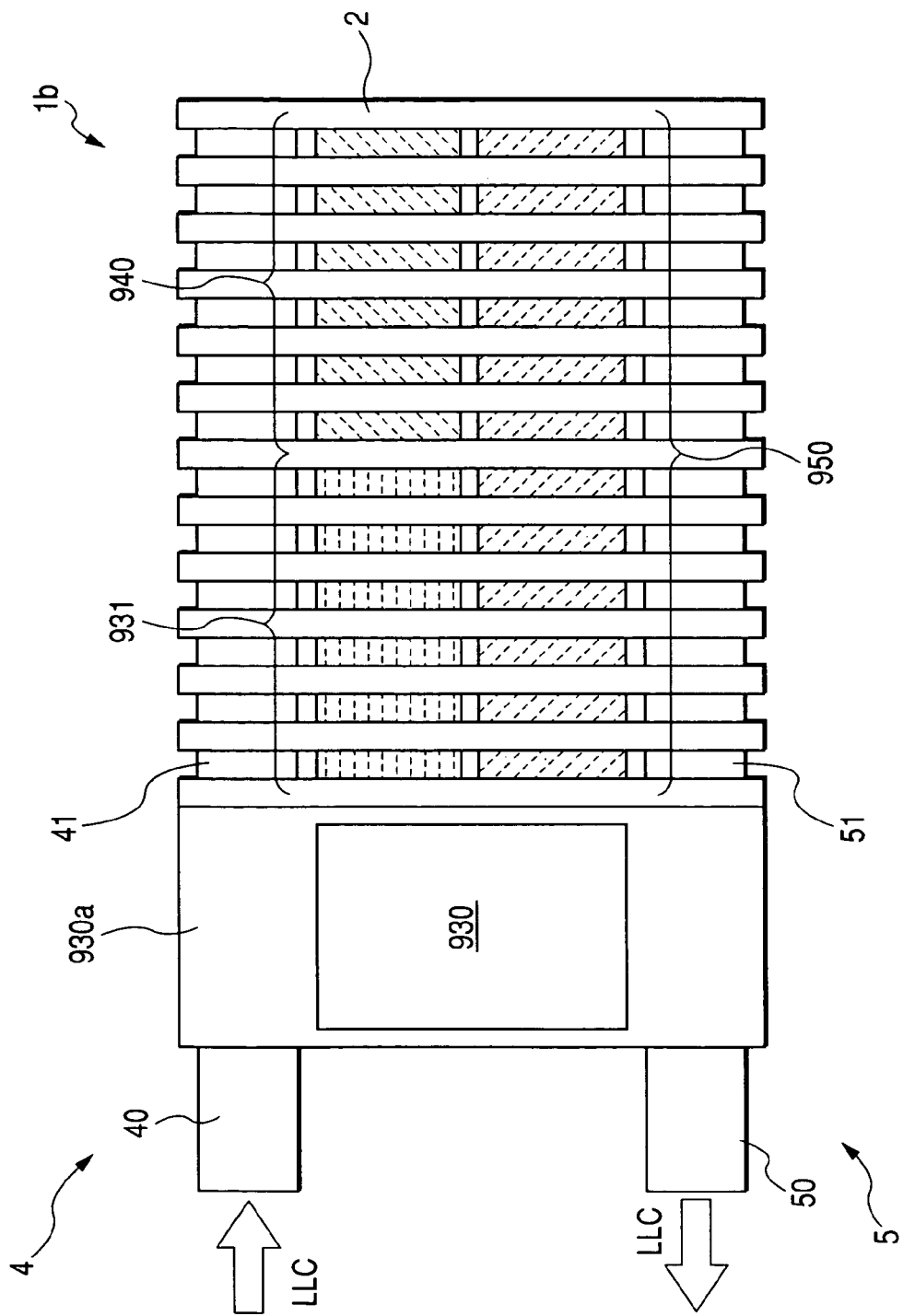
FIG. 12 is a plan view schematically showing a power stack in accordance with a third embodiment of the present invention.

FIG. 12 shows a schematic plan view of a power stack 1b in accordance with this embodiment. The components or portions corresponding to those shown in FIG. 11 are denoted by the same reference numerals and the same hatching. As shown in the drawing, all of the second switching module 950 (twelve in total) are disposed at the downstream side of the cooling pipes 2 in the flow direction of LLC (refer to FIG. 10). The converter switching modules 931 are disposed at the upstream side of six second switching modules 950 disposed adjacently to the electric reactor 930. Furthermore, the first switching modules 940 are disposed at the upstream side of the remaining six second switching modules 950 disposed far from the electric reactor 930.

The LLC temperature in the cooling passage of the cooling pipe 2 is lower at the upstream side than the downstream side. Therefore, the cooling ability of the cooling pipe 2 is higher at the upstream side than the downstream side. In view of the foregoing, the power stack 1b of this embodiment employs a layout of disposing the converter switching modules 931 and the first switching modules 940 having larger heat generation rates at the upstream side and disposing the second switching modules 950 having smaller heat generation rates at the downstream side. The power stack 1b of this embodiment can reduce or eliminate the imbalance in the cooling efficiency. Accordingly, the power stack 1b of this embodiment has excellent cooling balance.

Fourth Embodiment

The fourth embodiment is different from the first embodiment in that the second switching modules are replaced with dummy modules. Hereinafter, this embodiment is explained only about the differences.

Figure 13:
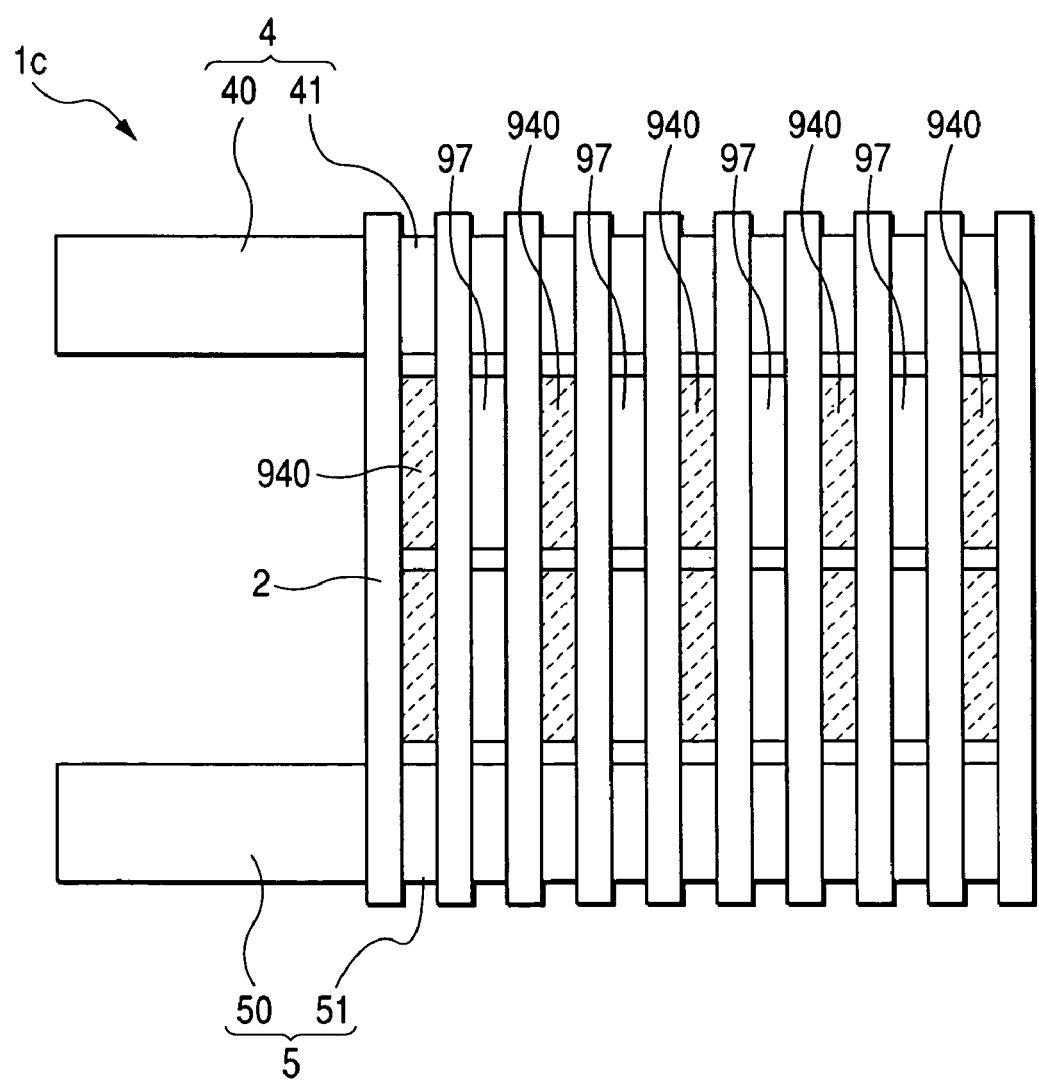
FIG. 13 is a plan view schematically showing a power stack in accordance with a fourth embodiment of the present invention.

FIG. 13 shows a schematic plan view of a power stack 1c in accordance with this embodiment. The components or portions corresponding to those shown in FIG. 7A are denoted by the same reference numerals and the same hatching. As shown in the drawing, according to the power stack 1c of this embodiment, a total of ten first switching modules 940 and a total of eight dummy modules 97 are alternately disposed in the laminating direction. Each dummy module 97 has a configuration substantially identical with the configuration of the first switching module 940.

The power stack 1c of this embodiment brings substantially the same functions and effects as those of the power stack of the first embodiment. Furthermore, the dummy module 97 generates no heat. Therefore, the cooling pipe 2 receives the heat from only one direction where the first switching module 940 is disposed. Therefore, the power stack 1c of this embodiment has higher cooling efficiency.

Furthermore, each cooling pipe 2 is tightly held between the dummy module 97 and the first switching module 940 because the assembly of the cooling pipes 2 is compressed from one or both sides in the laminating direction. Accordingly, if the dummy modules 97 are not provided, the compression force will not act entirely throughout the assembly of the cooling pipes 2. Therefore, it will be difficult to secure a sufficient heat transfer area between the first switching module 940 and the cooling pipe 2.

Furthermore, if the dummy modules 97 are not provided, a clearance corresponding to a dummy module 97 will be left between two neighboring cooling pipes 2. Therefore, the cooling pipes 2 may deform toward the clearance when subjected to the above-described compression force. Accordingly, even in this case, it will be difficult to secure a sufficient heat transfer area between the first switching module 940 and the cooling pipe 2.

On the other hand, the power stack 1c of this embodiment is equipped with the dummy modules 97 and can transmit the compression force everywhere in the assembly of the cooling pipes 2 when such a force is applied from both sides in the laminating direction. Furthermore, it becomes possible to prevent the cooling pipes 2 from deforming. Therefore, a sufficient heat transfer area can be secured between the first switching module 940 and the cooling pipe 2.

Fifth Embodiment

The fifth embodiment is different from the first embodiment in that one row of the first switching modules consists of three switching modules and one row of the second switching modules consists of three switching modules. Hereinafter, this embodiment is explained only about the differences.

Figure 14:
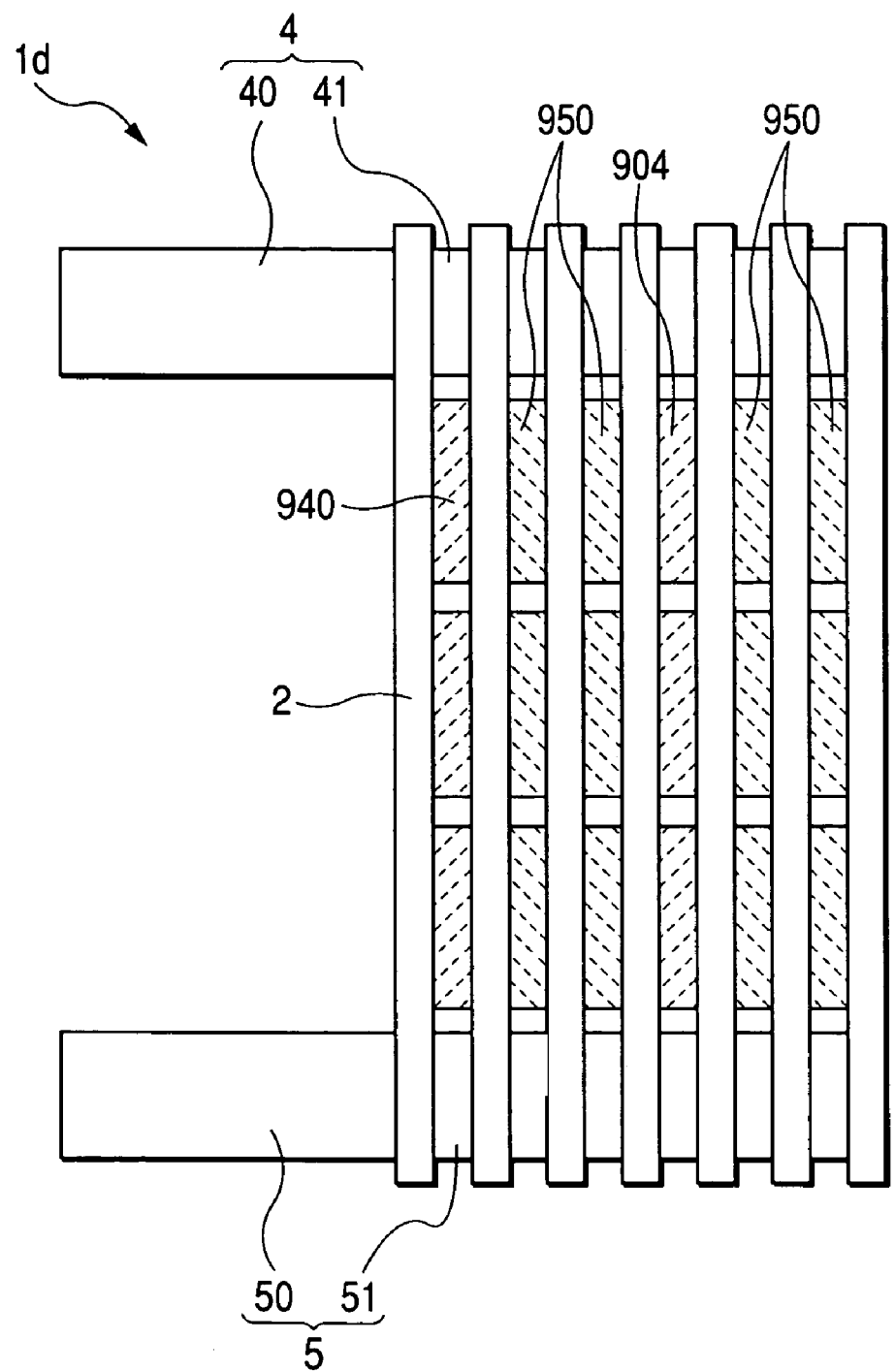
FIG. 14 is a plan view schematically showing a power stack in accordance with a fifth embodiment of the present invention.

FIG. 14 shows a schematic plan view of a power stack 1*d* in accordance with this embodiment. The components or portions corresponding to those shown in FIG. 7A are denoted by the same reference numerals and the same hatching. As shown in the drawing, the power stack 1*d* of this embodiment includes one row of first switching modules 940 extending in the longitudinal direction of the cooling pipe 2 which are arranged by a total of three first switching modules 940. Furthermore, the power stack 1*d* of this embodiment includes one row of second switching modules 950 extending in the longitudinal direction of the cooling pipe 2 which are arranged by a total of three second switching modules 950.

The power stack 1*d* of this embodiment brings substantially the same functions and effects as those of the power stack of the first embodiment. Furthermore, the power stack 1*d* of this embodiment can bring the effect of shortening the length in the laminating direction because three switching modules are disposed to arrange a single row. Furthermore, the total number of required cooling pipes 2 can be reduced.

Sixth Embodiment

The sixth embodiment is different from the fifth embodiment in that the first switching modules and the second switching modules are disposed to form the same row. Hereinafter, this embodiment is explained only about the differences.

Figure 15:
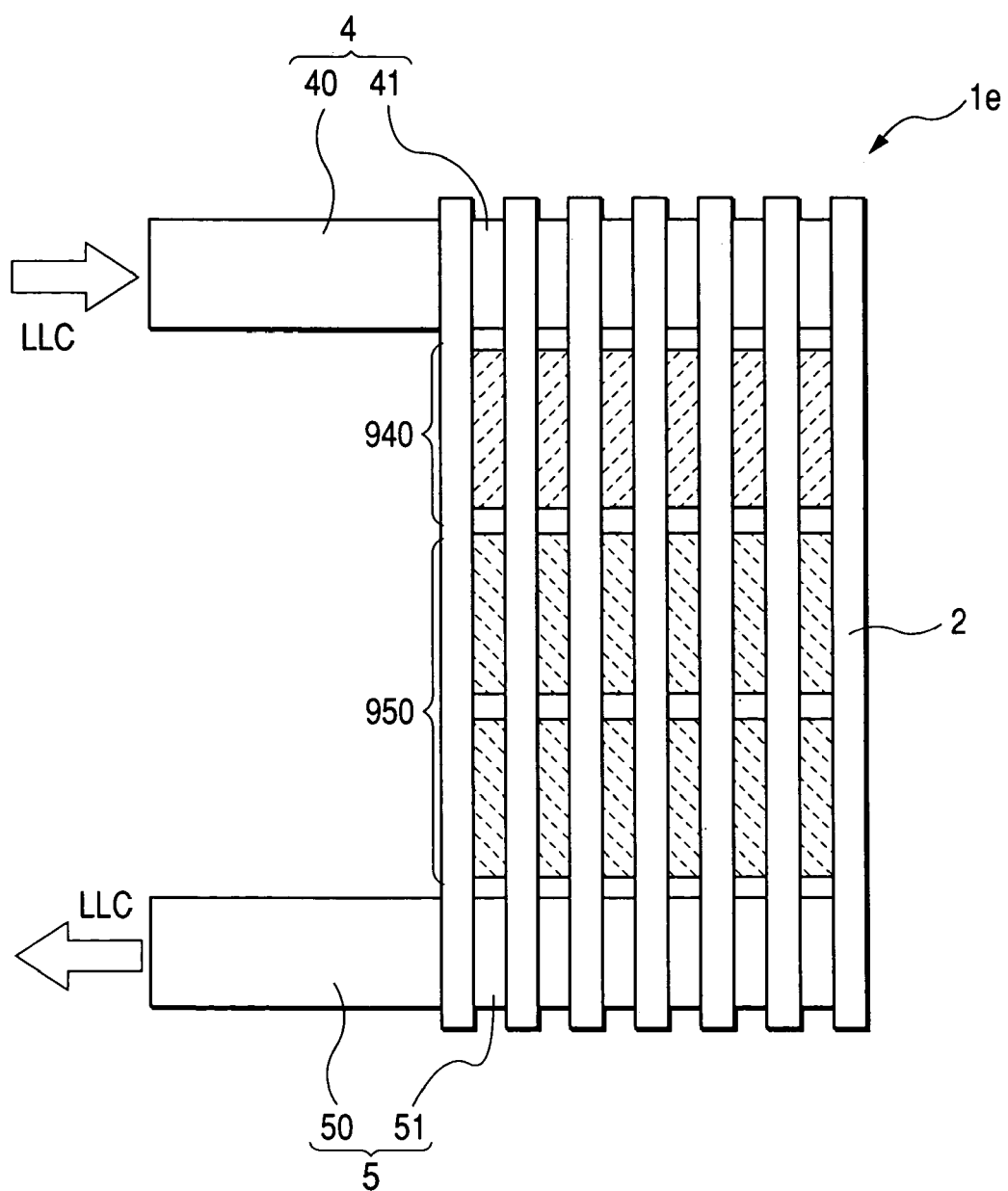
FIG. 15 is a plan view schematically showing a power stack in accordance with a sixth embodiment of the present invention.

FIG. 15 shows a schematic plan view of a power stack 1*e* in accordance with this embodiment. The components or portions corresponding to those shown in FIG. 14 are denoted by the same reference numerals. As shown in the drawing, according to the power stack 1*e* of this embodiment, a clearance between two neighboring cooling pipes 2 is filled with a combination of three switching modules, i.e. a first switching module 940 disposed at an upstream side, a second switching module 950 disposed at an intermediate position, and another second switching module 950 disposed at a downstream side.

As described above, LLC temperature in the cooling passage of the cooling pipe 2 is lower at the upstream side than the downstream side. Therefore, the cooling ability of the cooling pipe 2 is higher at the upstream side than the downstream side. In view of the foregoing, the power stack 1*e* of this embodiment employs a layout of disposing the first switching module 940 having a larger heat generation rate at the upstream side and disposing the second switching modules 950 having smaller heat generation rates at the intermediate position and the downstream side. The power stack 1*e* of this embodiment can reduce or eliminate the imbalance in the cooling efficiency. Accordingly, the power stack 1*e* of this embodiment has excellent cooling balance. Furthermore, the power stack 1*e* of this embodiment can bring the effect of shortening the length in the laminating direction because three switching modules are disposed to arrange a single row. Furthermore, the total number of required cooling pipes 2 can be reduced.

Other Modifications

Although the power stack of the present invention is explained based on various embodiments, the present invention is not limited to the above embodiments and can be modified variously.

For example, according to the above-described embodiments, each of the first switching modules 940, the second switching modules 950, and the converter switching modules 931 consists of the IGBT and the flywheel diode. However, the semiconductor elements of the present invention are not limited to IGBT and flywheel diode. For example, it is possible to use power MOS (i.e. Metal Oxide Semiconductor), GTO (i.e. Gate Turn-off Thyristor), or the like. Furthermore, the number of semiconductor elements used in one semiconductor module is not limited to a particular number. For example, it is preferable to dispose one power MOS in one semiconductor module.

Furthermore, according to the above-described embodiments, the dummy module 97 has the configuration substantially identical with the configuration of the first switching module 940. However, the configuration of the dummy module 97 is not limited particularly as far as the clearance between two neighboring cooling pipes 2 is sufficiently filled with the dummy module 97.

Furthermore, for example, according to the first embodiment, the switching modules are classified into one group consisting of six first switching modules 940 having larger heat generation rates and another group consisting of twelve second switching modules 950 having smaller heat generation rates. However, the number of switching modules arranging each group is not limited to a particular number. For example, it is possible to use a group consisting of only one semiconductor module.

Furthermore, according to the second and third embodiments, the electric reactor 930 is cooled by the main inlet pipe 40, the cooling pipe 2, and the main outlet pipe 50. However, it is possible to modify the arrangement so as to cool the electric reactor 930 by using at least one of these members. Furthermore, the number of semiconductor modules arranging a single row extending in the longitudinal direction of the cooling pipe 2 is not limited to a particular number.

Furthermore, in the case that the number of classified groups is three or more as shown in the second embodiment, it is not always necessary to alternately dispose the switching modules of all groups. For example, it is possible to alternately dispose two groups having different heat generation rates.

What is claimed is:

1. A power stack comprising a plurality of cooling pipes and a plurality of semiconductor modules which are alternately laminated, wherein
   each of said plurality of cooling pipes includes an inside space dissected into cooling passages in which coolant flows,
   both surfaces of said semiconductor module in a laminating direction are brought into contact with surfaces of neighboring cooling pipes,
   said plurality of semiconductor modules are classified into a plurality of groups mutually differentiated in their heat generation rates, and
   said plurality of semiconductor modules are disposed in such a manner that a pair of semiconductor modules belonging to the same group having the highest heat generation rate are prevented from being adjacent to each other so that any cooling pipe is not sandwiched between said pair of semiconductor modules of the same group in the laminating direction.

2. The power stack in accordance with claim 1, wherein said groups of semiconductor modules are classified according to controlled object devices of said semiconductor modules.

3. The power stack in accordance with claim 1, wherein said semiconductor modules and said cooling pipes respectively have a configuration flattened in the laminating direction.

4. The power stack in accordance with claim 1, wherein said semiconductor modules are repeatedly disposed in the laminating direction according to a predetermined pattern based on said groups.

5. The power stack in accordance with claim 4, further comprising a control circuit board having a plurality of connecting members to which said plurality of semiconductor modules are respectively connected, wherein
said connecting members are repeatedly disposed in the laminating direction according to a pattern identical with the pattern of said semiconductor modules.

6. The power stack in accordance with claim 1, further comprising an inlet pipe for introducing said coolant dividedly into said plurality of cooling pipes and an outlet pipe for collecting said coolant from said plurality of cooling pipes after finishing heat exchange, wherein said inlet pipe and said outlet pipe are disposed substantially parallel to each other, and a heat-generating member is interposed between a pre-division section of said inlet pipe and a post-merger section of said outlet pipe.

7. The power stack in accordance with claim 6, wherein a straight section is provided at a predetermined position of said pre-division section where said heat-generating member is disposed.

8. The power stack in accordance with claim 1, wherein at least one of said semiconductor modules is a dummy module generating no heat.

9. A power stack comprising a plurality of cooling pipes and a plurality of semiconductor modules which are alternately laminated, wherein
each of said plurality of cooling pipes includes an inside space dissected into cooling passages in which coolant flows,
both surfaces of said semiconductor module in a laminating direction are brought into contact with surfaces of neighboring cooling pipes,
said plurality of semiconductor modules are classified into a plurality of groups mutually differentiated in their heat generation rates, and
said plurality of semiconductor modules are disposed in such a manner that at least two semiconductor modules are disposed along a flow direction of said coolant in the cooling pipe and the heat generation rate of the semiconductor module disposed at an upstream side is not smaller than the heat generation rate of the semiconductor module disposed at a downstream side.

10. The power stack in accordance with claim 9, wherein said groups are classified according to controlled object devices of said semiconductor module.

11. The power stack in accordance with claim 9, wherein said semiconductor modules and said cooling pipes respectively have a configuration flattened in the laminating direction.

12. The power stack in accordance with claim 9, further comprising an inlet pipe for introducing said coolant dividedly into said plurality of cooling pipes and an outlet pipe for collecting said coolant from said plurality of cooling pipes after finishing heat exchange, wherein said inlet pipe and said outlet pipe are disposed substantially parallel to each other, and a heat-generating member is interposed between a pre-division section of said inlet pipe and a post-merger section of said outlet pipe.

13. The power stack in accordance with claim 12, wherein a straight section is provided at a predetermined position of said pre-division section where said heat-generating member is disposed.

14. The power stack in accordance with claim 9, wherein at least one of said semiconductor modules is a dummy module generating no heat.

* * * * *